United States Patent [19]

Lazzeroni et al.

[11] Patent Number: 4,977,975

[45] Date of Patent: Dec. 18, 1990

[54] VENTED MOTORCYCLE HELMET SPEAKER ENCLOSURE

[76] Inventors: John J. Lazzeroni; Melinda K. Lazzeroni, both of 7322 E. Stella Rd., Tucson, Ariz. 85730

[21] Appl. No.: 407,297

[22] Filed: Sep. 14, 1989

[51] Int. Cl.[5] ........................ H05K 5/00; H04R 25/00

[52] U.S. Cl. .................................... 181/129; 181/148; 181/153; 181/199; 381/183; 381/187; 2/6; 2/423

[58] Field of Search ...................... 181/18, 20, 22, 128, 181/129, 137, 160, 148, 153, 199; 381/154, 158, 183, 187; 2/5, 6, 423

[56] References Cited

U.S. PATENT DOCUMENTS

| | | | |
|---|---|---|---|
| 1,373,019 | 3/1921 | Rainey | 381/158 X |
| 1,847,702 | 3/1932 | Thuras | 381/158 |
| 1,964,606 | 6/1932 | Thuras | 381/158 |
| 3,246,721 | 4/1966 | Martin | 181/160 |
| 3,984,636 | 10/1976 | Turner | 381/158 X |
| 4,005,278 | 1/1977 | Görike | 381/154 |
| 4,109,105 | 8/1978 | Von Statten, Jr. | 381/187 X |
| 4,160,135 | 7/1979 | Görike | 381/158 |
| 4,167,223 | 9/1979 | Liesse | 187/131 |
| 4,239,945 | 12/1980 | Atoji | 381/187 X |
| 4,636,592 | 1/1987 | Scott | 381/187 |
| 4,637,489 | 1/1987 | Iwanaka | 181/160 |
| 4,742,887 | 5/1988 | Yamagishi | 181/129 |

*Primary Examiner*—Benjamin R. Fuller
*Attorney, Agent, or Firm*—J. Michael McClanahan

[57] ABSTRACT

A vented speaker enclosure for use in the ear pockets of motorcycle helmets is disclosed which carries off parasitic sound waves emitted from the rear side of an enclosed audio loudspeaker in order that the parasitic sound waves not be allowed to enter the motorcycle rider's ear and distort the primary sound waves issued from the audio loudspeaker. The vented speaker enclosure consists of a pair of joined together cup-shaped housing assemblies adapted to enclose and secure the audio loudspeaker, having openings in one face of the housing assemblies to allow passage of the sounds waves from the contained louspeaker, and a venting tube connected to an opening through the peripheral wall of the speaker enclosure, the vent tube carrying off and away the parasitic sounds emanating from the rear of the loudspeaker. The venting tube is situated in creases of the helmet inner cushion leading to the outside.

18 Claims, 1 Drawing Sheet

VENTED MOTORCYCLE HELMET SPEAKER ENCLOSURE

BACKGROUND OF THE INVENTION

1. Field of the Invention.

The field of the invention is audio loudspeaker enclosures fitting within the ear pockets of motorcycle helmets or helmets worn in a noisy environment.

2. Description of the Related Art.

In recent years, motorcycle riders have enjoyed vast improvements in communications. This is especially true in respect to communications between the motorcycle driver and passengers as well as other motorcycle drivers and passengers, all while the motorcycles are moving. Such improvements include the installation of microphones proximate the rider's and passenger's mouth by attachment to the motorcycle helmet, as well as the installation of headsets or earphones in both their helmets.

As might well be apparent, the motorcycle driver and passenger are exposed to vast amounts of noise ever present in their immediate environment. In addition to the noise of the motorcycle engine, the road sounds, i.e., sounds of the tires engaging the road, sounds of nearby vehicles including emergency vehicle sirens, the motorcycle rider and passenger are also bothered with the sounds of air rushing past the motorcycle, and past the body, face, and ears. The noise in a motorcycle helmet presents a very special environment in which sound enters the rider's ears.

An electronic circuit connecting to the microphone must, as far as possible, not amplify for transmission the sounds entering the microphone except for the driver's and passenger's speech. Similarly, the sound emitted from the earphones located in the helmets must enter the ear with maximum clarity and minimum distortion as much as possible, at least with respect to factors controllable in construction of the earphones and helmet.

In today's helmets, it is common to line the inside of the helmet with a layer of cushioning material, commonly styrene, and then cover the cushioning material with cloth or other similar lining material. In many cases, the cushioning material may have a thickness of ½ to 1 inch. Because people's ears tend to protrude from the head a short distance, it is common to place ear pockets in the cushioning material and liner, ear pockets merely being a void within the cushioning material surrounding the rider's and passenger's ears when the helmet is worn. This is especially true if it is intended to place an earphone or loudspeaker within the ear pocket directing its sound waves into the ear. Commonly, the ear pocket may have a depth equal to the thickness of the cushioning material, extending to the outer plastic, fiberglass, or metal shell comprising the helmet.

In the design of helmets, it would be desirable to have the rider's ear completely within the ear pocket with the surrounding cushioning material coming up very near to the rider's head. However, such a practice would not provide a comfortable helmet, and this is especially true when putting on or taking off the helmet, nor would such an arrangement be safe inasmuch as the ear may well be completely isolated from hearing sounds necessary to be heard, such as nearby emergency vehicles.

Accordingly, a compromise must be reached between how tightly a rider's ear may be encompassed by the ear pocket so as to reduce outside noise whereby the sound emitted from the ear pocket loudspeaker is readily understood, and the allowance of sounds from the outside environment, especially those sounds which may indicate potential danger.

In such respect, advances in motorcycle helmet design have been made in reducing noise coming in from the outside. However, advancement in the state of the art respecting loudspeakers placed into ear pockets has not been as remarkable. For example, it is entirely common today for the loudspeaker assemblies emplaced into the motorcycle helmet ear pockets to be placed within a speaker enclosure, usually a disk shaped container having a loudspeaker inside broadcasting through a plurality of small openings in one of the circular faces, the loudspeaker being immediately behind the circular face. It is also common to place venting holes in the rear circular face of the speaker enclosure in order that the rear chamber within the speaker enclosure and behind the loudspeaker be relieved in order to improve the audio quality output of the speaker. If the rear chamber behind the loudspeaker is completely sealed, then flexing movement of the cone and diaphragm of the loudspeaker has the effect of compressing and decompressing the air in the rear chamber, thus putting considerable constraints upon the frequency response of the speaker cone and diaphram, together with the power needed to drive it. To relieve the problem of compressing and decompressing the air in the rear chamber, the venting openings previously mentioned are placed in the rear face of the speaker enclosure. This bleeds the sound and pressure waves out the back of the speaker enclosure.

However, in using the speaker enclosures that are presently available having the rear venting opening and installing them in the ear pockets, it is noted that there is considerable distortion of the primary sound waves emanating from the speaker enclosure as the sound waves enter the rider's ears. This is especially true in the low frequency range of sounds. The inventor has investigated this sound distortion and lack of clarity and has discovered that substantially the problem lies in the sound waves emitted from the vented openings in rear of the speaker enclosure in that these parasitic sounds, being emitted by the backside of the loudspeaker diaphragm and cone, travel around the speaker enclosure situated within the ear pocket to mix with and distort the primary sounds being emitted directly from the front face of the speaker enclosure. This mixing of sound causes cancellation in some cases, amplification in other cases, all resulting in distortion of the sound waves as they impinge upon the rider's ears. If the back face of the speaker enclosure is sealed, then the primary sound emitted from the enclosure is substantially compromised.

Thus it is very apparent that sound characteristics within a motorcycle helmet environment is considerably different from that presented in ordinary speaker enclosure designs.

It is known to vent the rear chamber of a speaker enclosure by placing openings in the enclosure wall or to place a tube interiorly to the rear chamber which provides open communication to the environment immediately outside the enclosure. The latter is shown in the 1932 patent of Thuras, U.S. Pat. No. 1,847,702. It is also known in earphones of the type adapted to reside within a person's ear to have a duct extending from the housing for the reason of increasing the compliance and/or equivalent mass of the vibration system to reduce the resonance frequency of the earphone. For example, Yamagishi, in the U.S. Pat. No. 4,742,887, provides such a device. Yamagishi additionally provides, at the terminal end of this duct, openings to the environment. A duct is utilized because there are no alternatives to increasing the mass in an in-the-ear earphone. Yamagishi, however, does not provide an earphone for operation in the helmet environment.

It is readily apparent that the sound waves reaching the listener's ears may be obviously enhanced if apparatus were available which prevented the parasitic sound waves exiting the rear of the speaker from coming around the speaker enclosure and mixing with the speaker's primary output sound waves.

It is also obvious that there is need for apparatus which carry away the parasitic sound waves emanating from the rear of the speaker enclosure in a motorcycle helmet ear pocket so that the sound waves do not have the opportunity to travel to the front face side of the speaker enclosure and interfere with the primary emitted sound waves.

SUMMARY OF THE INVENTION

The embodiment of the invention described consists of a vented speaker enclosure for use in motorcycle helmets or other type of helmets worn in noisy environments wherein parasitic sound waves emanating from the rear of an audio loudspeaker contained within the enclosure are vented off in such a manner that they are constrained from mixing with primary sound waves issued from the front of the speaker. The sounds vented from the speaker enclosure are conveyed away from the speaker enclosure through the means of a flexible tube, preferably plastic, which attaches to the rear portion of the speaker enclosure to communicate openly with the chamber to the rear of the loudspeaker interiorly to the speaker enclosure.

In construction, the subject vented speaker enclosure comprises a circular disk having a thickness, the circular disk consisting of a pair of joined cupped-shaped housing assemblies, i.e., a front and rear cupped-shaped housing assembly, the two housing assemblies joined at their peripheral edges to form the circular disk. The front and rear circular faces of the disk are flattened. Interiorly to the speaker enclosure formed by the joined front and rear housing assemblies is the audio loudspeaker, the loudspeaker attached with its front facing the inside surface of the front housing assembly. A plurality of openings through the circular face of the front housing assembly provides means for sound emanating from the loudspeaker to pass through the speaker enclosure. The compartment or volume immediately behind the loudspeaker, but still within the inside of the enclosure, is defined as the rear chamber. Communicating the rear chamber with the immediate surrounding environment outside the enclosure is an opening, the opening in the preferred embodiment of the invention being half in the front housing assembly and half in the rear housing assembly, i.e., a half moon formed in each assembly which, when assembled and joined together, completes the circular opening. In alternate constructions, the opening may appear wholly in the rear housing assembly, or, for that matter, in the front housing assembly provided however, that the opening must communicate with the rear chamber.

In the preferred embodiment, the opening through the enclosure to the rear chamber consists of a short perpendicularly protruding tube or cylinder having a flared rolled-outward top edge which is adapted to be encompassed by a cupped-inward peripheral end formed in the flexible tubing. By such arrangement, the flexible tubing may be rotated on the outlet for desired specific placement.

In motorcycle helmets and other types of helmets, typically inside the outer shell is situated an inner protective liner having a thickness of ½ to 1 inch. Within that inner liner proximate the position of a wearer's ears, an ear pocket is formed by removal of part or all of the inner liner. The subject invention is adapted to be placed within that formed ear pocket. In most cases the speaker enclosure rear outside face is attached to the helmet shell by an adhesive. Preferably, this adhesive comprises two small pieces of velcro, one attached to the helmet shell and the other attached to the rear face of the speaker enclosure. By this method, the speaker enclosure is removable at will.

The flexible tubing emanating from the side of the speaker enclosure which carries away parasitic sound waves from the rear chamber of the speaker enclosure is permitted to exit the helmet by preparing an opening through the helmet liner which will receive the flexible tube, or, as is common in most helmets, there exists creases and folds in the lining material interiorly to the helmet into which the flexible tubing may then be placed. Preferably, the plastic tube is directed down and rearward of the rider's ear and out of the helmet ear pocket.

By such measures, parasitic sound waves emanating from the rear of the speaker enclosure no longer travel around the speaker enclosure in the ear pocket to mix with and distort the primary sound waves emanating from the front of the speaker enclosure and thus the motorcycle rider is afforded the original sounds from the speaker enclosure, not distorted as is the present situation.

According, it is an object of the subject invention to provide a vented speaker enclosure for motorcycle helmets wherein parasitic sound waves from the rear of the speaker are prohibited from mixing with and distorting the primary sound waves emanating from the front of the speaker enclosure.

It is another object of the subject invention to provide a motorcycle helmet vented speaker enclosure wherein the parasitic sound waves from the rear chamber of the speaker enclosure are vented directly out of the ear pocket.

It is still a further object of the subject invention to provide an environment in a motorcycle helmet ear pocket whereby parasitic sounds from the rear of the speaker enclosure are prevented from coming around the enclosure to mix with primary sound waves issuing from the front of the speaker enclosure.

It is still a further object of the subject invention to provide vented speaker enclosure which removes parasitic sound waves from the rear of the speaker enclosure by means of an open tube communicating interiorly with the speaker enclosure rear chamber.

Other objects of the invention will in part be obvious and will in part appear hereinafter. The invention accordingly comprises the apparatus possessing the construction, combination of elements, and arrangement of parts which are exemplified in the following detailed disclosure and the scope of the application which will be indicated in the claims.

BRIEF DESCRIPTION OF THE DRAWINGS

For further understanding of the features and objects of the subject invention, reference should be had to the following detailed description taken in connection with the accompanying drawings wherein:

FIG. 5.A. is a front view of the ear pocket portion of a motorcycle helmet showing the subject inventive vented speaker enclosure in an alternate embodiment;

FIG. 6.A. is a partial cross-sectional view of the inventive vented speaker enclosure showing an alternate embodiment of the venting tube attached to the vented speaker enclosure case.

In various views, like index numbers refer to like elements.

DETAILED DESCRIPTION OF THE PREFERRED EMBODIMENT

Figure 1:
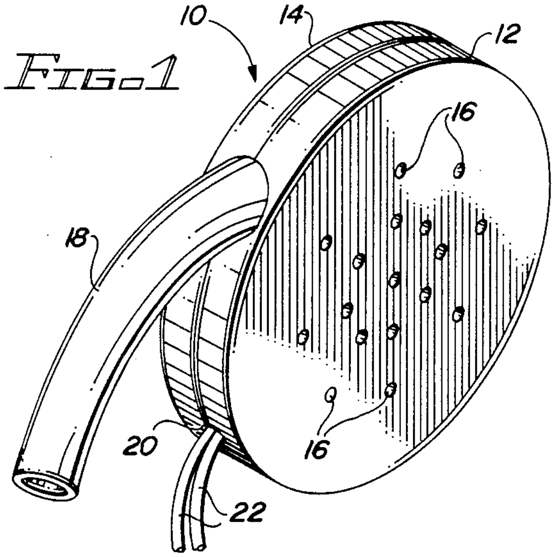
FIG. 1. is a perspective view of the subject inventive vented speaker enclosure.

Referring now to FIG. 1, a perspective view of the subject vented speaker enclosure 10 for use in motorcycle and other helmets is shown. Primarily, the subject vented speaker enclosure comprises two joined together cupped-shaped housing assemblies, namely front housing assembly 12 and rear housing assembly 14, preferably constructed of rigid plastic. The front and rear housing members are adapted to be joined together at their peripheral rim with an adhesive to form a volume or compartment. Situated on the flat circular disc surface of front housing 12 are a plurality of openings 16 through the wall or side of the front face, openings 16 adapted to permit the passage of sound waves issuing from an audio loudspeaker located interiorly to speaker enclosure 10, the sound waves to be heard by the helmet wearer.

Protruding from the peripheral cylindrical sides of both front and rear housing assemblies 12 and 14 is venting tube 18, venting tube 18 communicating openly with the interior of speaker enclosure 10. Venting tube 18 is an elongated hollow tube preferably constructed of flexible plastic material adapted to direct the emission of sound escaping from the rear chamber behind the speaker (not shown) situated within the speaker enclosure 10. An outlet (not shown), formed half in front housing 12 and half in rear housing 14, is encompassed by and holds one end of venting tube 18. Lastly, near the bottom of speaker enclosure 10 is outlet 20 formed one half in each of the front and rear housing assemblies 12 and 14 through which passes the electrical leads 22 which supply electrical power to the audio speaker enclosed.

Figure 2:
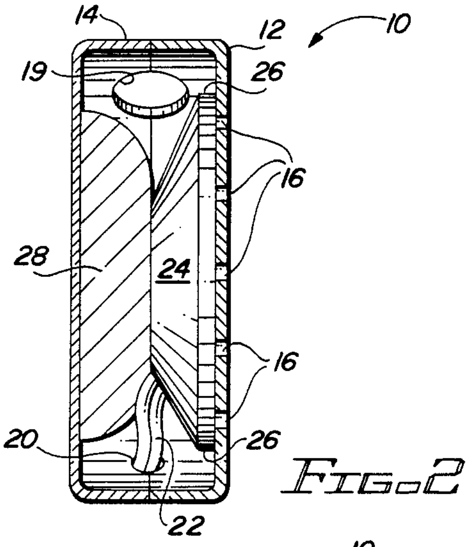
FIG. 2. is a cross-sectional view of the subject inventive vented speaker enclosure.

FIG. 2 is a cross-sectional view of vented speaker enclosure 10 disclosing the elements interiorly to the enclosure. Audio loudspeaker 24 is shown proximate openings 16 in the front circular face of front housing 12, speaker 24 attached to the inside flat circular surface of cupped shaped front housing 12 by means of a circular grommet 26. Grommet 26, in the preferred embodiment, comprises a rubber ring operably attached by adhesives on one side to the inside face surface of housing 12 and on its other side to the peripheral rim of loudspeaker 24. Grommet 26 serves to seal the front sound emitting portion of speaker 24 to the flat circular face of enclosure 12 to form the front chamber in that the primary sound waves issuing from speaker 24 should pass only through the openings 16. Thus grommet 26 also prevents sound waves emanating from the front output of speaker 24 from entering the rear chamber, i.e., that portion of the speaker enclosure behind audio loudspeaker 24.

Situated in the rear chamber portion of speaker enclosure 10 is opening 19 formed in the peripheral cylindrical sides or walls of the front and rear housing assemblies 12 and 14. Rubber foam 28 immediately behind speaker 24 serves the purpose of helping to secure speaker 24 in place and to absorb a portion of the unwanted parasitic sound waves which emanate from the rear output of the speaker 24. In the bottom of the drawing are the pair of electrical leads 22 which are connected to speaker 24 and which pass outside of speaker enclosure 10 through sealed opening 20.

Figure 3:
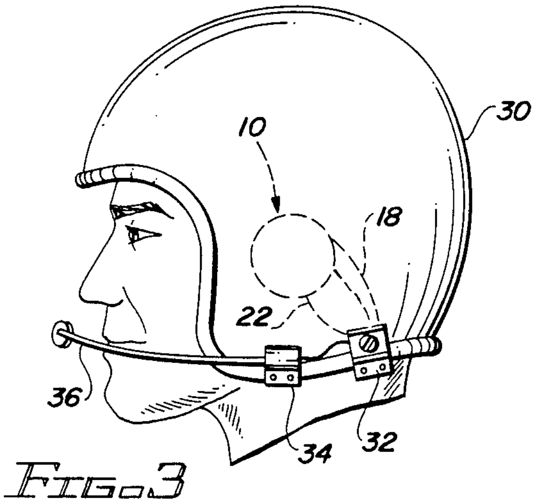
FIG. 3. is a side elevation view of an operator wearing a motorcycle helmet with the subject invention situated therein.

Referring now to FIG. 3, a side elevational view is shown of a motorcycle rider utilizing the invention in motorcycle helmet 30, the location of the vented speaker enclosure 10 shown in dotted fashion in the ear pocket formed in the cushion lining of the helmet. Shown in FIG. 3 are venting tube 18 and electrical leads 22 emerging from speaker enclosure 10. Venting tube 18 shown emerging from speaker enclosure 10 vents parasitic sound waves from the rear chamber of speaker enclosure 10 to the lower portion of helmet 30, preferably to the lower lip of helmet 30 below and behind the rider's ear so that parasitic sound waves escaping from the venting tube 18 have no opportunity to mix with primary sound waves emanating from the front housing assembly, which are directed into the rider's ear. Also shown in FIG. 3 are mounting brackets 32 and 34, the first of which receives, among other things, the electrical leads 22 from speaker enclosure 10, and the second of which supports boom 36 extending a microphone in front of the rider's mouth.

It is of course realized that there will be a total of two speaker enclosures 10 in each helmet, one for each of the rider's ears.

Figure 4:
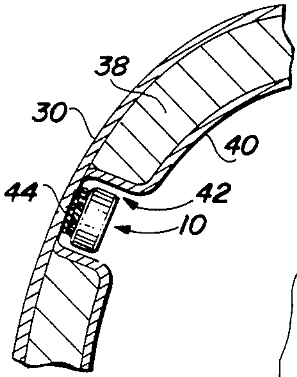
FIG. 4. is a cross-sectional view taken through a motorcycle helmet with the subject inventive vented speaker enclosure situated therein.

Referring now to FIG. 4, a partial cross-sectional view of helmet 30 showing the invention in place in the helmet is detailed. Motorcycle safety helmets are typically manufactured having a hardened outer shell, shown by the numeral 30, commonly composed of a very durable plastic or resin composition, and an inner cushion, such as that enumerated 38, which may have a thickness of $\frac{1}{2}$ to 1 inch, and lastly an inner liner 40, which generally composes a plastic or cloth material. The inner cushion is attached to the outer shell by an adhesive and the inner liner similarly attached to the inner cushion with an adhesive. Formed within the inner cushion 38 is the ear pocket 42 wherein the inner cusion has been removed, or a substantial portion of the inner cushion has been removed in order to receive firstly the rider's ears, and secondly, other apparatus such as earphones or the like. Here the vented speaker enclosure 10 is attached to the helmet shell 30 by an adhesive or, more commonly, velcro-type fastening 44.

By the construction of the ear pocket and the location of the invention within the ear pocket shown in FIG. 4, the rider's ear resides in the ear pocket or just at its edge with the inner cushion, and the speaker enclosure 10 is directed straight into the ear. It is not intended that the speaker enclosure 10 should actually touch the ear, although it will be situated a quarter to half inch away from it. As mentioned earlier, the problem which exists with the prior art motorcycle helmet earphones and speaker enclosures is that parasitic sound waves which emanate from the rear chamber of the speaker enclosure, usually from rear venting holes in the face of the rear housing portion and especially in the low frequency range, bounce off the helmet shell and the inner liner around the enclosure to come back into and interfere with the primary sound waves emitting from the front output portion of the speaker enclosure. This causes distortion, cancellation, and/or reinforcement of the sound waves emanating from the front housing assembly of the speaker enclosure. Thus, in the prior art, there was always degradation of the sound entering the ear of the motorcycle rider making the audio difficult to understand and causing different types of distortion with different frequencies of sound so that it was not possible to avoid the problem by electronically adjusting or modifying the sound in accordance with its particular frequency.

In the subject invention, the problem alluded to above is alleviated by containing the unwanted sound waves emanating from the rear of the speaker inside the speaker enclosure and venting these parasitic sound waves off through the venting tube nestled in a passageway formed in the inner cushion or through creases in the inner cushion and liner to preferably a point behind and below the rider's ear, but certainly out of the ear pocket.

Figure 5:
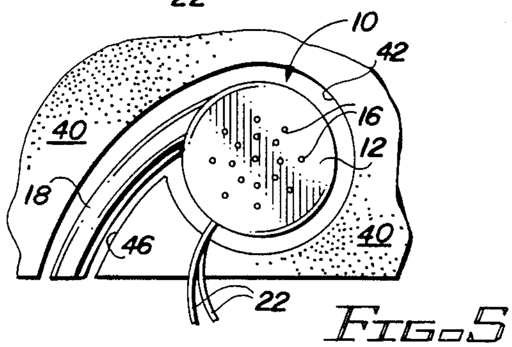
FIG. 5. is a front view of the ear pocket portion of a motorcycle helmet showing the inventive vented speaker enclosure.

In FIG. 5, a front view is shown taken of a portion of helmet 30 looking directly at the subject inventive speaker enclosure 10 situated in the ear pocket 42 formed in the helmet cushion and lining 40. More specifically, cup-shaped front housing 12 is shown in a front view disclosing its circular face with openings 16 which permit the emergence of primary sound waves from the interior speaker (not shown) to the rider's ear (not shown). Surrounding the speaker enclosure 10 are the walls of ear pocket 42. Connecting the lower rear portion of the helmet to ear pocket 42 is crease 46 formed in the inner liner and cushion adapted to receive the venting tube 18 attached to speaker enclosure 12. In the alternative, existing creases headed in the direction desired may be utilized. It may be necessary to manually open the crease to accept the venting tube. The cushioning material and liner then naturally covers the tube. It is entirely possible, since a venting tube may have a diameter in the order of $\frac{1}{4}$ to $\frac{3}{8}$ inch, to form a passageway through the center of the thickness of the cushion material from the lower lip of the helmet to the ear pocket to receive the venting tube. In such case, the outer surface of the cushion material and liner 40 will not be disturbed at all one observing the helmet would not notice the passageway. At the lower lip of the helmet, the passageway may continue through lining 40 if desired or, if lining 40 is of a porous material, it may not be necessary to have an opening in the lining material.

The venting tube is so constructed in the preferred embodiment that it is easily removed from and placed onto the vented speaker enclosure such that the tube may, if desired, permanently reside in the crease or in the passageway formed in the cushion with the venting tube protruding into the ear pocket ready to receive the speaker enclosure. In case of a passageway, the venting tube may be inserted into the passageway through the ear pocket and it is obvious that the venting tube need not span the complete distance from the ear pocket to the lower lip of the helmet inasmuch as the passageway formed in the inner cushion will also serve to conduct the sound out of the helmet.

Figure 5A:
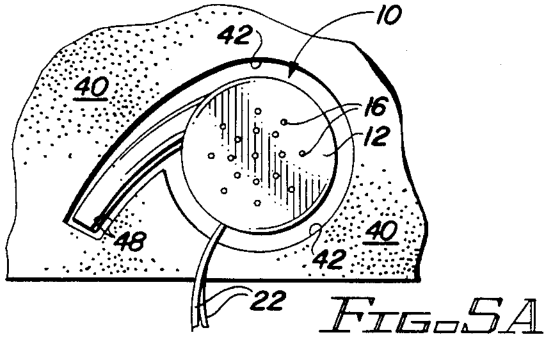

Still further, it is apparently obvious that if the inner cushion is made of a sound absorbent material, such as a cellular plastic which has a qualities of sound absorption, the passageway may be a blind passageway ending within the inner cushion such that the venting tube removes the parasitic sound waves from the speaker enclosure to be absorbed in the inner cushion at a point remote from the ear pocket in order that there be no chance, however remote, that the parasitic sound may enter the rider's ear. Such an embodiment is shown in FIG. 5.A. wherein vented tube 18 is situated in blind passageway 48 which is in itself dead ended. FIG. 5A., like FIG. 5 is a front view of the inside of a helmet showing vented speaker enclosure 10 within ear pocket 42.

Figure 6:
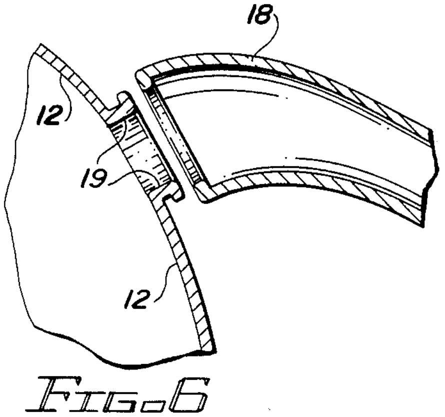
FIG. 6. is a partial cross-sectional view of the vented speaker enclosure showing the attachment of the venting tube to the speaker enclosure.
Figure 6A:
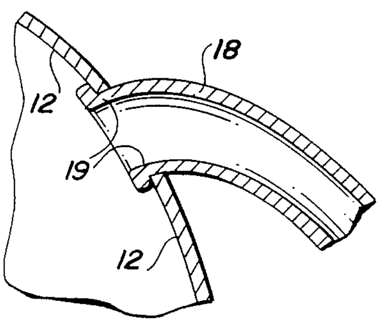

Referring now to FIG. 6, a partial cross-sectional view of speaker enclosure 10 is shown where, for simplicity, only a portion of cupped-shaped front housing 12 is shown with half of opening 19. Opening 19, in the preferred embodiment, includes a protruding cylinder or tube with a rolled outward circular peripheral lip. One end of venting tube 18 is modified to provide a receptacle to encompass this lip provided on opening 19, the end having a cupped inward lip. By such means, vent tube 18 may be rotated around its position on opening 19 such as to accommodate convenient placement of the tube in the inner cushion and liner of the helmet.

FIG. 6.A. shows still another embodiment illustrating the relationship of venting tube 18 with the front and rear housing assemblies of the speaker enclosure wherein venting tube 18 actually penetrates through opening 19 in housing 12. Preferably, upon the end of venting tube 18 may be formed on outwardly protruding boss so as to keep venting tube 18 in place, although, still permitting rotation of venting tube 18 in opening 19.

It is realized of course that while in the preferred embodiment, venting tube 18 lies within a crease or passageway formed in inner cushion 38, yet the purposes of the invention will still be substantially accomplished with tube 18 (while attached to the speaker enclosure 10) emerging from the ear pocket and lying upon the top of inner lining 14, preferably pointing down and to the rear of the helmet.

While a preferred embodiment of the invention, together with an alternate embodiment, has been shown and described, it is appreciated that other such embodiments of the invention are possible and that there is no intent to limit the invention by such disclosure, but rather it is intended to cover all modifications and alternate embodiments falling within the spirit and the scope of the invention as defined in the appended claims.

I claim:

1. A speaker enclosure for use in motorcycle helmets for preventing mixing of parasitic sound waves with primary sound waves issuing from the speaker enclosure, the speaker enclosure comprising:

a first and second cup-shaped housing assembly, said first and second housing assembly joined together to form an enclosure, each said housing assemblies having a flat circular face;

an audio loudspeaker secured interiorly to said first cup-shaped housing assembly, said loudspeaker having a front output side and a rear output side, primary sound waves issuing from said loudspeaker front output side and parasitic sound waves issuing from said loudspeaker rear output side;

a plurality of first openings through said circular face of said first cup-shaped housing assembly proximate said loudspeaker front output side to permit emergence of primary sound waves;

a rear chamber interiorly to said enclosure rearward of said loudspeaker rear output side, said rear chamber excluding said loudspeaker front output side;

a second opening through said enclusure, said second opening providing open communication between said rear chamber and outside said enclosure; and a venting tube exteriorly to said enclosure, said venting tube operably attached to said enclosure second opening communicating with said rear chamber, said venting tube receiving for conveying away parasitic sound waves emanating from said loudspeaker rear output to a desired location whereby the parasitic sound waves issuing from said enclosure rear chamber are conveyed away to prevent mixing with the primary sound waves issuing from said first openings of said enclosure first housing assembly circular face.

2. The speaker enclosure as defined in claim 1 wherein each said first and said second cup-shaped housing assemblies include a cylindrical peripheral side joining to said flat circular face, said first and second housing assemblies cylindrical sides joined together to form said enclosure.

3. The speaker enclosure as defined in claim 2 wherein said second opening is through said enclosure cylindrical peripheral sides.

4. The speaker enclosure as defined in claim 3 wherein said second opening is partially in said first cup-shaped housing assembly cylindrical peripheral side and partially in said second cup-shaped housing assembly cylindrical peripheral side.

5. The speaker enclosure as defined in claim 4 wherein said second opening defines a cylinder protruding exteriorly from said enclosure cylindrical peripheral sides, said cylinder having a distal end and at said distal end, a rolled outward lip receiving said venting tube.

6. The speaker enclosure as defined in claim 5 wherein said venting tube operably attached to said second opening defines a tube of two ends, one end of which has a rolled inward cupped edge, said edge encompassing said second opening cylinder rolled outward lip, said venting tube adapted to rotate upon said second opening protruding cylinder.

7. The venting tube as defined in claim 6 wherein said venting tube comprises flexible plastic whereby the tube may be so oriented as to direct the parasitic sound waves where desired.

8. The speaker enclosure as defined in claim 4 wherein said venting tube operably attached to said second opening protrudes inwardly to said enclosure.

9. The speaker enclosure as defined in claim 8 wherein said venting tube has two ends, the first end of which has an outwardly directed rolled edge whereby said venting tube inserted in said second opening has said rolled outward edge engaging said second opening.

10. An improvement in a speaker enclosure for use in motorcycle helmets for enhancement of sound waves issuing from said speaker enclosure entering an ear of a helmet wearer, the speaker enclosure having a contained audio loudspeaker with a front output side and a rear output side, the loudspeaker front output side issuing primary sound waves and the rear output side issuing parasitic sound waves, a plurality of first openings in the enclosure proximate the front output side of the loudspeaker permitting exiting of primary sound waves from the enclosure, a rear chamber within the enclosure juxtaposed the rear output side of the loudspeaker, the rear chamber receiving parasitic sound waves issued from the rear output side of the loudspeaker, the improvement comprising:

a second opening through the speaker enclosure and into the rear chamber providing an outlet for the parasitic sound waves; and means to remove and convey away from the speaker enclosure the parasitic sound waves contained within the rear chamber, said means including a venting tube situated exteriorly to said speaker enclosure, said venting tube operably attached to said second opening whereby parasitic sound waves may be vented exteriorly away from the speaker enclosure and thereby not distort the primary sound waves issuing from the speaker enclosure.

11. The improvement in a speaker enclosure as defined in claim 10, wherein said second opening through the speaker enclosure includes an outwardly protruding cylinder having a rolled outward lip adapted to be encompassed by said venting tube.

12. The improvement in a speaker enclosure as defined in claim 11 wherein said venting tube has two ends, one end of which has a rolled inward edge, said rolled inward edge encompassing said rolled outward lip of said second opening protruding cylinder whereby said venting tube is held upon said second opening protruding cylinder in a rotatable configuration.

13. The improvement in a speaker enclosure as defined in claim 10 wherein said venting tube has two ends, the first end of which protrudes inwardly said second opening into said rear chamber, said first end of said tube within said rear chamber having a rolled outward edge, said outward edge engaging said second opening to secure said venting tube.

14. In combination, a protective helmet and speaker enclosure for enhancement of sound waves entering ears of a helmet wearer by avoiding mixing of primary sound waves issuing from the speaker enclosure with parasitic sound waves also issuing from the speaker enclosure, the combination comprising:

a protective helmet having an inner liner, said inner liner having formed therein a pair of ear pockets proximate the ears of the wearer;

a pair of speaker enclosures, one each of said speaker enclosures situated interiorly to one each of said ear pockets, each one of said speaker enclosures including means receiving and conveying away the parasitic sound waves from each one of said speaker enclosure and each one of said ear pockets, said means including a venting tube operably attached exteriorly to each one of said speaker enclosures whereby parasitic sound waves will not mix with primary sound waves issuing from said pair of speaker enclosures.

15. The combination as defined in claim 14 wherein said protective helmet inner liner contains a pair of passageways, one each of said pair of said passageways connecting with one of each said ear pockets, each one of said passageways directed away from each one said ear pockets.

16. The combination as defined in claim 15 wherein each one of said passageways formed in said inner liner receives said venting tube connected to each one of said speaker enclosures whereby parasitic sounds conveyed from each one of said speaker enclosures by said venting tubes is conveyed into each one of said passageways.

17. The combination as defined in claim 16 wherein said protective helmet has a lower lip surrounding the helmet wearer, and each one of said passageways in said inner liner connects each one of said ear pockets with said helmet lower lip whereby the parasitic sound waves from each one of said speaker enclosures is conveyed through said venting tube situtated in each one of said passageways to said protective helmet lower lip.

18. The combination as defined in claim 14 wherein each one of said speaker enclosures includes:

an audio loudspeaker secured and contained interiorly in each one of said speaker enclosures, said loudspeaker having a front output side and a rear output side, primary sound waves issuing from said loudspeaker front output side and parasitic sound waves issuing from said loudspeaker rear output sides;

a plurality of first openings through each one of said speaker enclosures proximate said loudspeaker front output side to permit emergence of primary sound waves;

a rear chamber interiorly to each one of said speaker enclosures rearward of said contained loudspeaker rear output side;

a second opening through each one of said speaker enclosures, said second opening providing communication between said rear chamber and outside each one of said speaker enclosures, said second opening operably connected to said venting tube whereby parasitic sound waves are received and conveyed away from each one of said helmet ear pockets by said venting tube whereupon the parasitic soundwaves will not mix with the primary sounds issuing from said first openings in each one of said speaker enclosures.

* * * * *